United States Patent [19]

Takemae

[11] Patent Number: 4,803,656
[45] Date of Patent: Feb. 7, 1988

[54] SEMICONDUCTOR MEMORY DEVICE HAVING REDUNDANCY CIRCUIT PORTION

[75] Inventor: Yoshihiro Takemae, Tokyo, Japan

[73] Assignee: Fujitsu Limited, Kawasaki, Japan

[21] Appl. No.: 28,463

[22] Filed: Mar. 20, 1987

[30] Foreign Application Priority Data

Mar. 20, 1986 [JP] Japan .............................. 61-060929

[51] Int. Cl.$^4$ .............................................. G11C 7/00
[52] U.S. Cl. ........................................ 365/200; 371/10
[58] Field of Search ......................... 365/200; 371/10

[56] References Cited

U.S. PATENT DOCUMENTS

| 4,376,300 | 3/1983 | Tsang | 371/10 X |
| 4,428,068 | 1/1984 | Baba | 365/200 |
| 4,480,199 | 10/1984 | Varshrey et al. | 365/200 X |
| 4,592,024 | 5/1986 | Sakai et al. | 371/10 X |

Primary Examiner—Stuart N. Hecker
Assistant Examiner—Andrew L. Sniezek
Attorney, Agent, or Firm—Staas & Halsey

[57] ABSTRACT

A semiconductor memory device including a regular memory cell array in which a plurality of word lines and bit lines are provided, and a plurality of memory cells are arranged at each intersection of the word lines and bit lines; a redundancy memory cell array in which one or more word lines and bit lines are provided, and a plurality of memory cells are arranged at each intersection of the word lines and bit lines; a control unit for generating a first control signal; a unit for programming defective address bits corresponding to a defective memory cell existing in the regular memory cell array; a unit for comparing each logic or input address bits with each of the defective address bits; a first switch for generating a second control signal when at least one logic of the input address bits does not coincide with the corresponding defective address bit and for supplying a third control signal to a predetermined word line or bit line belonging to the redundancy memory cell array without generating the second control signal when each logic of the input address bits coincides with each of the defective address bits; a unit for identifying whether or not the defective address bits are programmed in the programming means; and a second switch for supplying the second control signal input from the first switch to a selected word line or bit line belonging to the regular memory cell array when the identifying unit indicates that the defective address bits are programmed in the programming means and for supplying the first control signal input from the control unit to the selected word line or bit line when the identifying unit indicates that the defective address bits are not programmed in the programming unit.

2 Claims, 8 Drawing Sheets

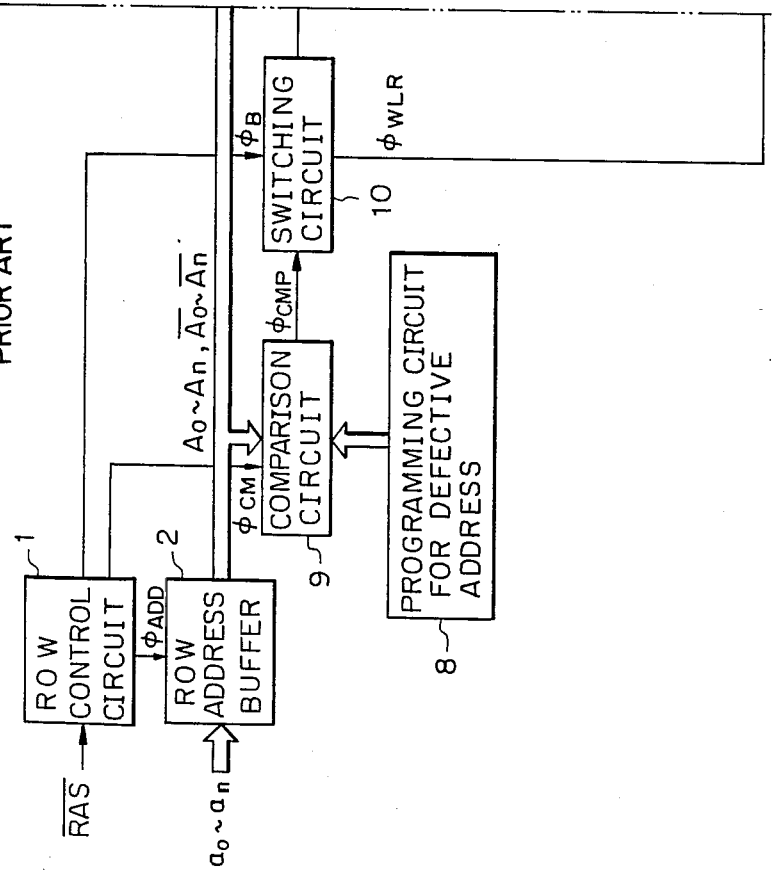

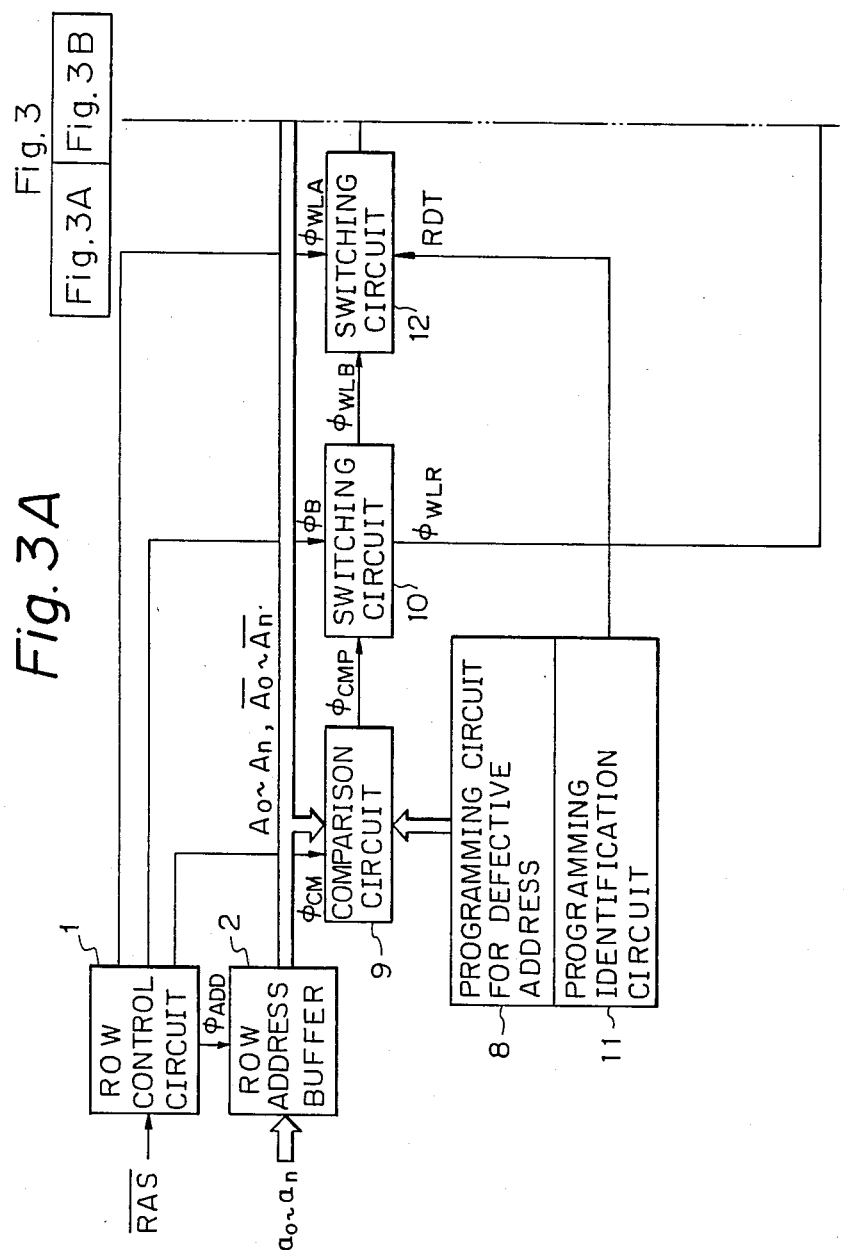

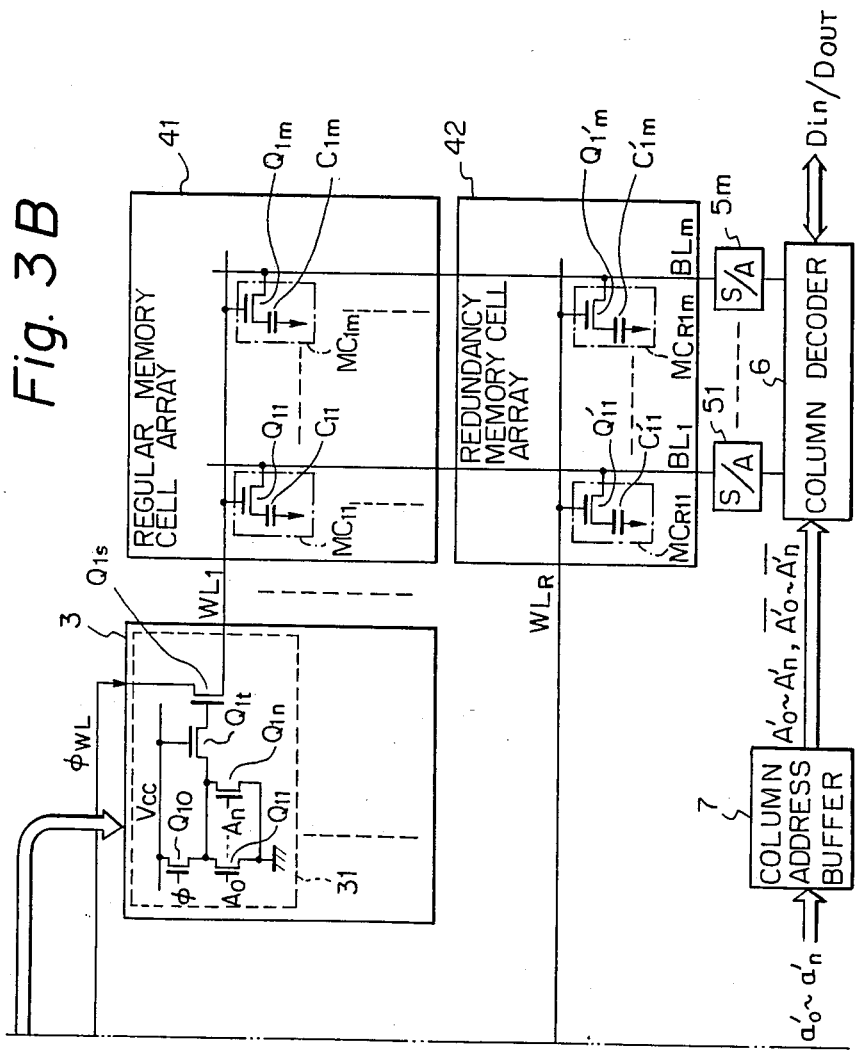

SEMICONDUCTOR MEMORY DEVICE HAVING REDUNDANCY CIRCUIT PORTION

BACKGROUND OF THE INVENTION

1. Field of the Invention

The present invention relates to a semiconductor memory device. Particularly, the present invention relates to a semiconductor memory device having a redundancy memory cell array.

2. Description of the Related Art

Generally, the conventional semiconductor memory device is provided with a row control circuit, a row address buffer, a row decoder and driver, a regular memory cell array, a sense amplifier, a column address buffer, a column decoder, and so on. A row address strobe signal ($\overline{RAS}$) is input to the row control circuit from the external, and the row control circuit supplies control signals to the row address buffer and the row decoder and driver at a predetermined timing, respectively.

When the potential level of the signal $\overline{RAS}$ becomes low, the control signal is supplied from the row control circuit to the row address buffer. The row address buffer then supplies row address bit signals to the row decoder and driver, and when the potential levels of the row address bit signals output from the row address buffer have been established, the control signal is supplied from the row control circuit to the row decoder and driver. The row decoder and driver then select a predetermined word line, and the potential thereof is raised in accordance with the potential levels of the input row address bit signals.

Thus, in the read mode, data stored in a predetermined memory cell arranged at the intersection of the selected word line and a selected bit line provided in the regular memory cell array is read out through the selected bit line, sense amplifier, and data bus provided in the column decoder. Also, in the write mode, predetermined data is written from the external to the predetermined memory cell connected to the selected word line through the data bus and the selected bit line.

In this connection, the column decoder selects a predetermined bit line in accordance with potential levels of the input column address bit signals supplied from the column address buffer.

Also, known is a conventional semiconductor memory device having a redundancy memory cell array in addition to the regular memory array. Provided in such a memory device are, a programming circuit for programming the defective address bits corresponding to a defective memory cell existing in the regular memory cell array, a comparison circuit for comparing each logic of the input address bits (for example, input row address bit signals) with each of the programmed defective address bits and for detecting whether or not each logic of the input row address bits coincides with each of the programmed address bits, and a switching circuit for supplying control signals to the row decoder and driver for the regular memory cell array and for the redundancy memory cell array, respectively, in accordance with the result of the above comparison.

Accordingly, when the potential levels of the row address bit signals output from the row address buffer have been established, a control signal is supplied from the row control circuit to the comparison circuit. The comparison circuit then, compares each logic of the input row address bits with each logic of the defective address bits programmed in the programming circuit, and an output signal having a predetermined potential level is supplied from the comparison circuit to the switching circuit in accordance with the result of the comparison.

Further, when the potential level of the output signal from the comparison circuit has been established, a control signal is supplied from the row control circuit to the switching circuit, and the switching circuit carries out a switching operation in accordance with the logic of the output signal from the comparison circuit.

Namely, when the comparison circuit detects that at least one logic of the input row address bits does not coincide with the corresponding defective row address bit programmed in the programming circuit, the potential of the output signal from the comparison circuit becomes low level, for example, and when the potential level of the output signal from the comparison circuit has been set to low level, the above control signal from the row control circuit is supplied through the switching circuit to the row decoder and driver, to select a predetermined word line provided in the regular memory cell array in accordance with the potential levels of the input row address bit signals. Thus, data stored in a predetermined memory cell arranged at the intersection of the selected word line and the selected bit line provided in the regular memory cell array is read out, or predetermined data is written from the external to the predetermined memory cell.

On the other hand, when the comparison circuit detects that each logic of the input row address bits coincides with each of the defective row address bits programmed in the programming circuit, the potential of the output signal from the comparison circuit becomes high level, for example, and when the potential level of the output signal from the comparison circuit has been set to high level, the above control signal from the row control circuit is supplied through the switching circuit to the redundancy row decoder and driver, to select a predetermined redundancy word line provided in the redundancy memory cell array in accordance with the input row address bit signals corresponding to the programmed defective address bits.

Accordingly, data stored in a predetermined redundancy memory cell arranged at the intersection of the selected redundancy word line and the selected bit line provided in the redundancy memory cell array is read out, or predetermined data is written from the external to the predetermined redundancy memory cell. At this time, the word line corresponding to the defective row address bits provided in the regular memory cell array is in the non-selected state.

As above-mentioned, in the memory device having the redundancy memory cell array, the time required for selecting a predetermined word line provided in the regular memory cell array or the redundancy memory cell array is delayed by the time required for establishing the potential level of the output signal supplied from the comparison circuit to the switching circuit, compared with the time required for selecting a predetermined word line provided in the regular memory cell array in the memory device not having the redundancy memory cell array.

Therefore, in a conventional memory device having the redundancy memory cell array, a problem arises in that, even if a defective memory cell does not exist in the regular memory cell array and the redundancy memory cell array is not used (i.e., even if defective address bits are not programmed in the programming circuit), the operation timing for selecting a predetermined word line provided in the regular memory cell array (i.e., the access timing for a selected memory cell connected to the selected word line) is delayed by the above-mentioned time, compared with the corresponding timing in the memory device not having the redundancy memory cell array.

SUMMARY OF THE INVENTION

The present invention has been attained to solve the above-mentioned problem, and the object of the present invention is to increase the access speed for the predetermined memory cell corresponding to the selected address bits when the defective address bits are not programmed in the programming circuit in the semiconductor memory device having the redundancy memory cell array.

To attain the above-mentioned object, according to the present invention, there is provided a semiconductor memory device comprising a regular memory cell array in which a plurality of word lines and bit lines are provided, and a plurality of memory cells are arranged at each intersection of the word lines and bit lines; a redundancy memory cell array in which one or more word lines and bit lines are provided, and a plurality of memory cells are arranged at each intersection of the word lines and bit lines; control means for generating a first control signal; means for programming defective address bits corresponding to defective memory cells existing in the regular memory cell array; means for comparing the logics of input address bits with the defective address bits; a first switching means for generating a second control signal when at least one logic of the input address bits does not coincide with the corresponding defective address bit and for supplying a third control signal to a predetermined word line or bit line belonging to the redundancy memory cell array without generating the second control signal when the logics of the input address bits coincide with the defective address bits; means for identifying whether or not the defective address bits are programmed in the programming means; and a second switching means for supplying the second control signal input from the first switching means to a selected word line or bit line belonging to the regular memory cell array when the identifying means indicates that the defective address bits are programmed in the programming means and for supplying the first control signal input from the control means to the selected word line or bit line when the identifying means indicates that the defective address bits are not programmed in the programming means.

According to the above construction, when the identifying means indicates that the defective address bits are not programmed in the programming means, a predetermined memory cell corresponding to the input address bits is directly selected without comparing the logics of the input address bits with the defective address bits, and thus, it is possible to increase the access speed for the predetermined memory cell corresponding to the input address bits when the defective address bits are not programmed in the programming means.

BRIEF DESCRIPTION OF THE DRAWINGS

FIGS. 2, 2A, 2B show another example of the construction of the conventional semiconductor memory device having a redundancy memory cell array;

FIGS. 3, 3A, 3B show the construction of the semiconductor memory device according to one embodiment of the present invention;

DESCRIPTION OF THE PREFERRED EMBODIMENTS

Figure 1:
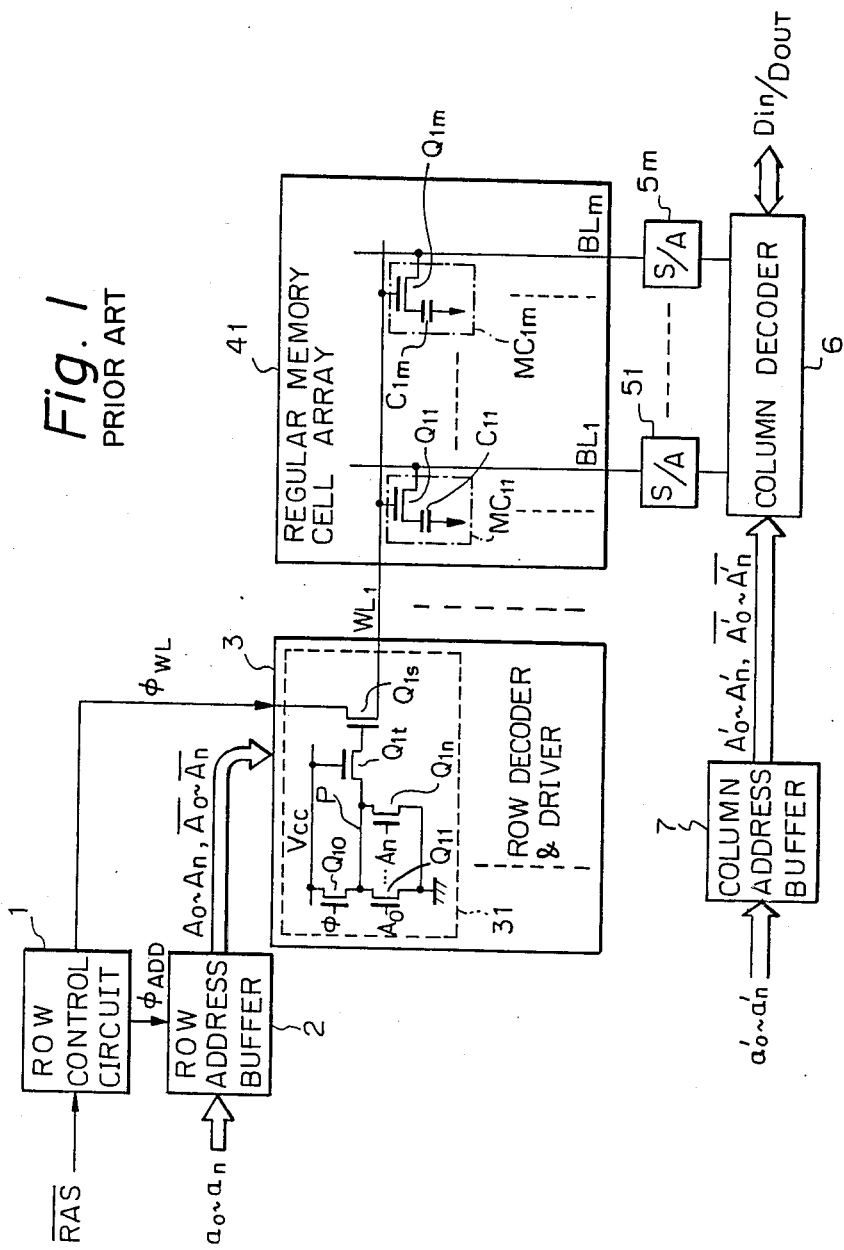
FIG. 1 shows an example of the construction of a conventional semiconductor memory device.

In order to clarify the background of the present invention, an example of the construction of the conventional semiconductor memory device is shown in FIG. 1. In this connection, FIG. 5 is a timing chart concerning the potential changes of several signals and a selected word line in the device shown in FIG. 1.

In FIG. 1, reference numeral 1 is a row control circuit to which a row address strobe signal $\overline{RAS}$ is input from the external, and generates control signals $\phi_{ADD}$ and $\phi_{WL}$ each generated at a predetermined timing as described below.

Reference numeral 2 is a row address buffer to which external row address bit signals $A_o$ to $A_n$ having TTL (Transistor-Transistor-Logic) potential levels are input, and at the timing when the potential level of the signal $\overline{RAS}$ becomes low, the control signal $\phi_{ADD}$ is supplied from the row control circuit 1 to the row address buffer 2. Accordingly, the row address buffer 2 outputs row address bit signals $A_o$ to $A_n$ and $\overline{A_o}$ (an inverted bit signal of $A_o$) to $\overline{A_n}$ (an inverted bit signal of $A_n$) each having a MOS potential level (i.e., the high level and the low level correspond to the $V_{CC}$ level and $V_{SS}$ level, respectively), as shown in FIG. 5.

Figure 5:
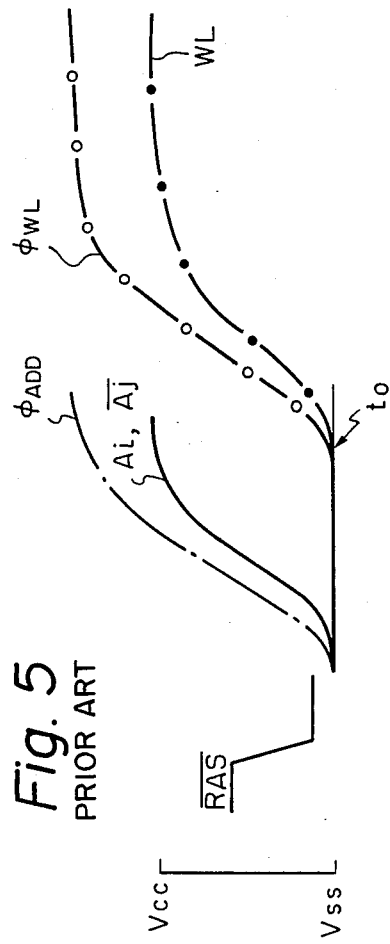
FIG. 5 is a timing chart concerning the potential changes of several signals and a selected word line in the device shown in FIG. 1.

Reference numeral 3 is a row decoder and driver to which the row address bit signals $A_o$ to $A_n$ and $\overline{A_o}$ to $\overline{A_n}$ are supplied from the row address buffer 2, and at the timing "to" shown in FIG. 5 at which potential levels of the above signals $A_0$ to $A_n$ and $\overline{A_0}$ to $\overline{A_n}$ output from the row address buffer 2 have been established (in this connection, FIG. 5 shows that the potential levels of row address bit signals $A_i$ and $\overline{A_j}$ are high, and therefore, the potential levels of the corresponding inverted row address bit signals $\overline{A_i}$ and $A_j$ are low), the control signal $\phi_{WL}$ is supplied from the row control circuit 1 to the row decoder and driver 3. Accordingly, the row decoder and driver 3 selects a predetermined word line, for example, $WL_1$, in accordance with the potential levels of the input row address bit signals $A_0$ to $A_n$ and $\overline{A_0}$ to $\overline{A_n}$.

In this connection, a circuit portion 31 provided in the above row decoder and driver 3 is an example of decoder and driver circuit for selecting the word line $WL_1$ when the potential levels of the input row address bit signals $A_0$ to $A_n$ are all low (i.e., the potential levels of the input row address bit signals $\overline{A_0}$ to $\overline{A_n}$ are all high) Namely, in the circuit 31, the potential level of a control signal $\phi$ changes in phase with that of the signal $\overline{RAS}$, and when the potential level of the signal $\phi$ is high, a precharging transistor $Q_{10}$ is turned ON, and the potential of a node p corresponding to the connecting point between the precharging transistor $Q_{10}$ and decoding transistors $Q_{11}$ to $Q_{1n}$ becomes high level ($V_{CC}$ level). Next, when the potential level of the signal $\phi$ becomes low (i.e., when the precharging transistor $Q_{10}$ is turned OFF), if the potential levels of the input row address bit signals $A_0$ to $A_n$ are all low, all decoding transistors $Q_{11}$ to $Q_{1n}$ are turned OFF, and the high potential of the node p is supplied to a gate of a transistor $Q_{1s}$ through a transfer gate transistor $Q_{1t}$. Thus, the transistor $Q_{1s}$ is turned ON, the above-mentioned control signal $\phi_{WL}$ is suppled to the word line $WL_1$ through the transistor $Q_{1s}$, and the potential level WL of the selected word line (in this case, $WL_1$) becomes high, as shown in FIG. 5. However, at this time, if at least one of the potential levels of the input row address bit signals $A_0$ to $A_n$ is high (i.e., at least one of the potential levels of the input row address bit signals $\overline{A_0}$ to $\overline{A_n}$ is low), at least one of the decoding transistors $Q_{11}$ to $Q_{1n}$ is turned ON, and thus the potential of the node p in the above circuit 31 becomes low. Accordingly, the potential of the corresponding word line $WL_1$ does not become high. As a result, the word line $WL_1$ is non-selected, and another predetermined word line is selected by the corresponding decoder and driver circuit in accordance with the potential levels of the input row address bit signals $A_0$ to $A_n$ and $\overline{A_0}$ to $\overline{A_n}$.

Reference numeral 41 is a regular memory cell array in which a plurality of word lines ($WL_1$, and so on) and a plurality of bit lines ($BL_1$ to $BL_m$) are provided, and a plurality of memory cells ($MC_{11}$ to $MC_{1m}$, and so on) are arranged at each intersection of the word lines and bit lines. Each of the memory cells (for example, $MC_{11}$) comprises a transfer gate transistor $Q_{11}$ and a capacitor $C_{11}$ for storing data.

When reading data stored in the predetermined memory cell $MC_{11}$, for example, the potential of the selected word line $WL_1$ is raised as above-mentioned. Accordingly, the data stored in the capacitor $C_{11}$ is supplied to a sense amplifier 51 through the transfer gate transistor $Q_{11}$ and the selected bit line $BL_1$. This data is then sensed and amplified by the sense amplifier 51 and is output as output data $D_{out}$ through the selected bit line $BL_1$ and data bus provided in a column decoder 6.

Also, when writing data $D_{in}$ from the external to the predetermined memory cell $MC_{11}$, for example, the data $D_{in}$ is supplied to the memory cell $MC_{11}$ through the above data bus, the selected bit line $BL_1$, and the transfer gate transistor $Q_{11}$ connected to the selected word line $WL_1$.

In this connection, the column decoder 6 selects a predetermined bit line (for example, $BL_1$) in accordance with the potential levels of the input column address bit signals $A'_0$ to $A'_n$ and $\overline{A'_0}$ $\overline{A'_n}$. Reference numeral 7 denotes a column address buffer to which external column address bit signals $A'_0$ to $A'_n$ are input, and the column address buffer 7 supplies the column address bit signals $A'_0$ to $A'_n$; and to $\overline{A'_n}$ to the column decoder 6, in the same way as the row address buffer 2.

Figure 2B:
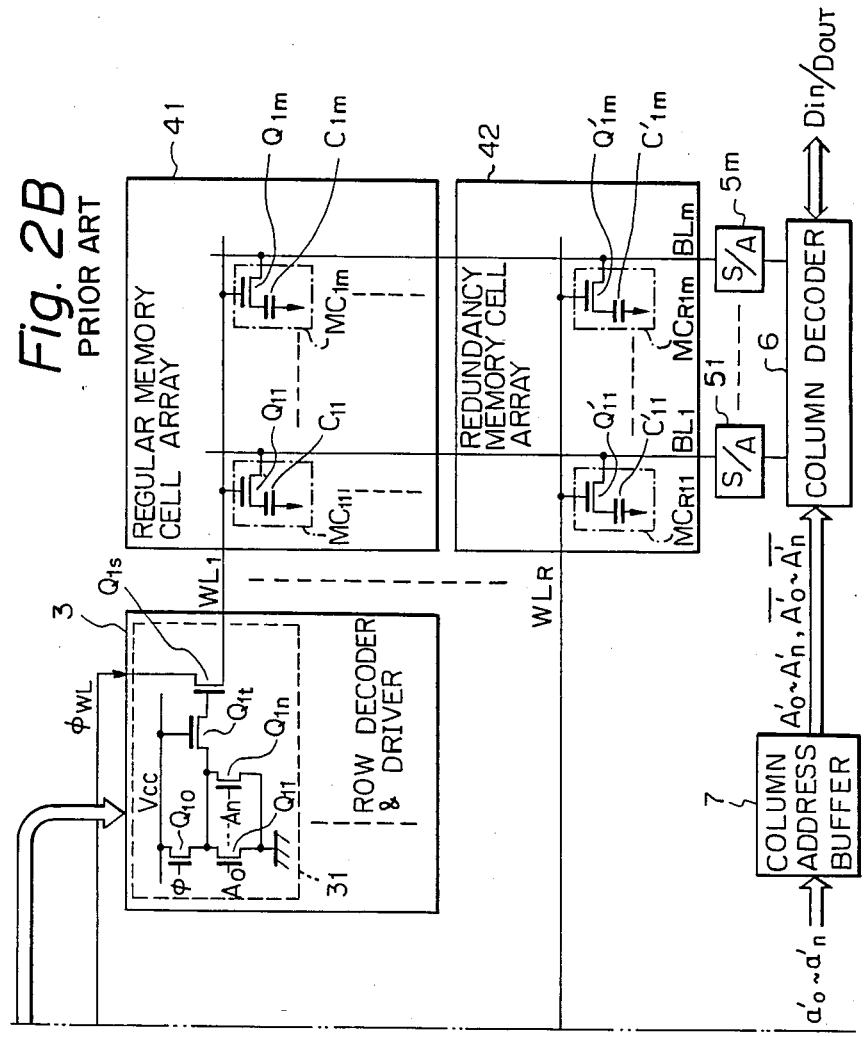
Figure 6:
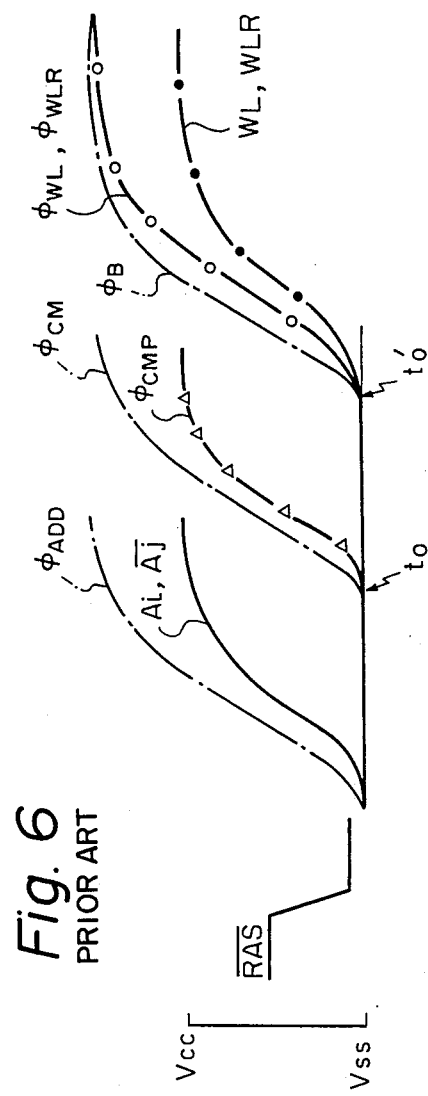
FIG. 6 is a timing chart concerning the potential changes of several signals and a selected word line in the device shown in FIG. 2.

FIG. 2 shows another example of the construction of the conventional semiconductor memory device in which a redundancy memory cell array 42 is provided in addition to the regular memory cell array 41. In FIG. 2, the same reference numerals or symbols as in FIG. 1 are given to the portions or signals corresponding to those in FIG. 1. FIG. 6 is a timing chart for the potential changes of several signals and a selected word line in the device shown in FIG. 2.

In a memory device as shown in FIG. 2, the test for the regular memory cell array 41 is carried out before forwarding the device to the next process, in order to detect whether or not a defective memory cell exists in the regular memory cell array 41. Accordingly, if a defective memory cell is detected, the defective address bit signals corresponding to the defective memory cell (in this case, defective row address bits) are programmed in a programming circuit (for example, a read only memory) 8 for programming the defective address bits.

Thus, in the operation of the device, when the potential levels of the row address bit signals $A_0$ to $A_n$ and $\overline{A_0}$ to $\overline{A_n}$ output from the row address buffer 2 have been established at the timing "$t_0$" shown in FIG. 6, a control signal $\phi_{CM}$ is supplied from the row control circuit 1 to a comparison circuit 9. The comparison circuit 9 compares each logic (in this case, each potential) of the row address bit signals (for example, $A_0$ to $A_n$) input thereto with each logic of the defective address bits programmed in the programming circuit (ROM) 8, and an output signal $\phi_{CMP}$ having a predetermined potential level is supplied from the comparison circuit 9 to a switching circuit 10 in accordance with the result of the comparison. As shown in FIG. 6, the output $\phi_{CMP}$ is generated at the above timing "$t_0$" by supplying the above control signal $\phi_{CM}$ from the row control circuit 1 to the comparison circuit 9.

Further, when the potential level of the output signal $\phi_{CMP}$ has been established at the timing "$t'_0$" shown in FIG. 6, the control signal $\phi_B$ is supplied from the row control circuit 1 to the switching circuit 10, and the switching circuit 10 carries out the switching operation in accordance with the logic (in this case, the potential level) of the output signal $\phi_{CMP}$.

Namely, when the comparison circuit 9 detects that at least one logic of the input row address bits $A_0$ to $A_n$ does not coincide with the corresponding defective row address bit programmed in the programming circuit 8, the potential of the output signal $\phi_{CMP}$ becomes low level, for example. Thus, at the above timing "$t'_0$", at which the potential level of the above signal $\phi_{CMP}$ has been set to a low level, the above control signal $\phi_B$ is supplied through the switching circuit 10 to the word decoder and driver 3, as the control signal $\phi_{Wl}$ for a selected word line.

As a result, the word decoder and driver 3 raises the potential WL (shown in FIG. 6) of the selected word line (for example, $WL_1$) provided in the regular memory cell array 41, in accordance with the potential levels of the input row address bit signals $A_0$ to $A_n$ and $\overline{A_0}$ to $\overline{A_n}$. Thus, data stored in a predetermined memory cell $MC_{11}$, for example, arranged at the intersection of the selected word line (for example, $WL_1$) and the selected bit line (for example, $BL_1$) is read out as the output data $P_{out}$, or the input data $D_{in}$ is written to the predetermined memory cell (for example, $MC_{11}$), as above-mentioned.

On the other hand, when the comparison circuit 9 detects that each logic of the input row address bits $A_0$ to $A_n$ coincides with each of the defective row address bits programmed in the programming circuit 8, the potential of the output signal $\phi_{CMP}$ becomes high level, for example. Thus, at the above timing "$t'_0$", at which the potential level of the above signal $\phi_{CMP}$ has been set to a high level, the above control signal $\phi_B$ is supplied through the switching circuit 10 to a redundancy word line $WL_R$ provided in the redundancy memory cell array 42, as a control signal $\phi_{WLR}$ for the above redundancy word line.

As a result, the potential WLR (shown in FIG. 6) of the redundancy word line $WL_R$ becomes high level. Accordingly, data stored in a predetermined redundancy memory cell $MC_{R11}$, for example, arranged at the intersection of the redundancy word line $WL_R$ and the selected bit line (for example, $BL_1$) is read out as the output data $D_{oput}$, or the input data $D_{in}$ is written to the predetermined redundancy memory cell (for example, $MC_{R11}$). At this time, the word line corresponding to the defective row address, for example, $WL_1$, provided in the regular memory cell array 41 is in a non-selected state.

As above-mentioned, in the memory device having the redundancy memory cell array as shown in FIG. 2, the time required for selecting a predetermined word line provided in the regular memory cell array 41 or the redundancy memory cell array 42 is delayed compared with the above time in the memory device not having the redundancy memory cell array as shown in FIG. 1, due to the switching operation of the switching circuit 10 based on the potential level of the output signal $\phi_{CMP}$ supplied from the comparison circuit 9. Namely, in the memory device shown in FIG. 2, the timing "$t'_0$" shown in FIG. 6 at which the potential WL of the selected word line or the potential WLR of the selected redundancy word line rises is delayed compared with the timing "$t_0$" shown in FIG. 5 at which the potential WL of the selected word line rises in the memory device shown in FIG. 1.

Therefore, in such a conventional memory device as shown in FIG. 2, a problem arises in that, even if a defective memory cell does not exist in the regular memory array 41 and the redundancy memory cell array 42 is not used (i.e., even if defective address bits are not programmed in the programming circuit 8), the operation timing for selecting a predetermined word line provided in the regular memory cell array (i.e., the access timing for a selected memory cell connected to the selected word line) is delayed compared with the corresponding timing in the memory device as shown in FIG. 1.

Figure 7A:
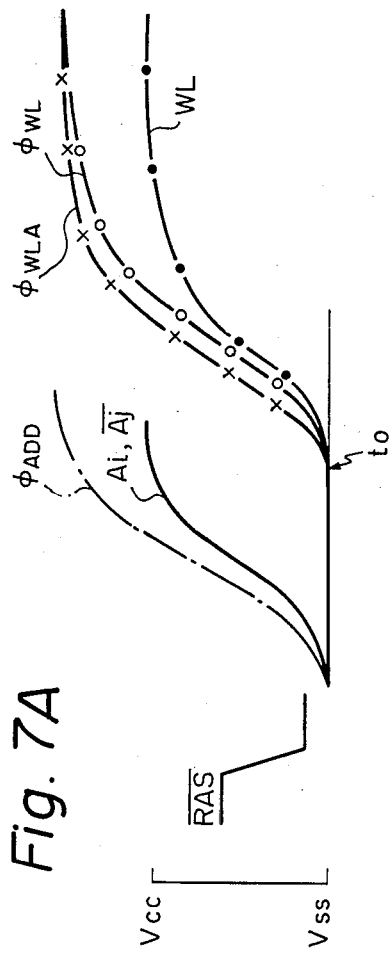
FIG. 7A and FIG. 7B are timing charts concerning the potential changes of several signals and a selected word line in the device shown in FIG. 3.
Figure 7B:
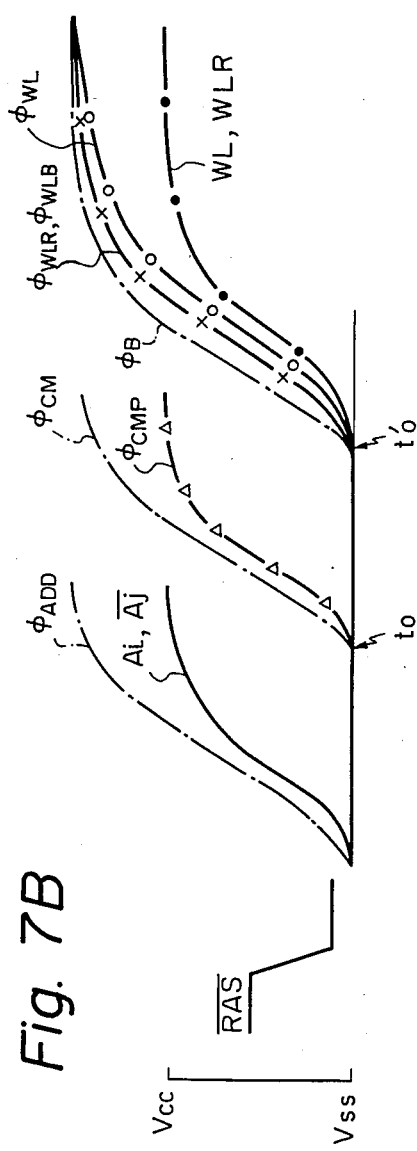

The present invention has been attained to solve the above-mentioned problem, FIG. 3 shows the overall construction of the semiconductor memory device according to one embodiment of the present invention. In FIG. 3, the same reference numerals or symbols as in FIG. 2 are given to the portions or signals corresponding to those in FIG. 2. FIG. 7A and FIG. 7B are timing charts concerning the potential changes of several signals and a selected word line in the device shown in FIG. 3. In this connection, FIG. 7A corresponds to the time chart in the case wherein defective address bits are not programmed in the programming circuit (ROM) 8, and FIG. 7B corresponds to the time chart in the case wherein the defective address bits are programmed in the programming circuit (ROM) 8.

As above-mentioned concerning the memory device shown in FIG. 2, when the potential level of the output signal $\phi_{CMP}$ has been established at the timing "$t'_0$" shown in FIG. 7B, the control signal $\phi_B$ is supplied from the row control circuit 1 to the switching circuit 10, and the switching circuit 10 carries out the switching operation in accordance with the logic of the output signal $\phi_{CMP}$ supplied from the comparison circuit 9.

Namely, when the comparison circuit 9 detects that at least one logic of the input row address bits $A_0$ to $A_n$ does not coincide with corresponding defective row address bit programmed in the programming circuit 8, the potential of the output signal $\phi_{CMP}$ becomes low level, for example. Accordingly, at the above timing "$t'_0$", at which the potential level of the above signal $\phi_{CMP}$ has been set to a low level, the above control signal $\phi_B$ is supplied from the row control circuit 1 to the switching circuit 10, and thus, the switching circuit 10 supplies a control signal $\phi_{WLB}$ to a switching circuit 12 as described below.

On the other hand, when the comparison circuit 9 detects that each logic of the input row address bits $A_0$ to $A_n$ coincides with each of the defective row address bits programmed in the programming circuit 8, the potential of the output signal $\phi_{CMP}$ becomes high level, for example. Accordingly, at the above timing "$t'_0$", at which the potential level of the above signal $\phi_{CMP}$ has been set to a high level, the above control signal $\phi_B$ is supplied through the switching circuit 10 to the redundancy word line WLR as the control signal $\phi_{WLR}$. As a result, the potential WLR (shown in FIG. 7B) of the redundancy word line $WL_R$ becomes high level. Accordingly, data stored in the predetermined redundancy memory cell $MC_{R11}$, for example, is read out as the output data $D_{out}$, or the input data $D_{in}$ is written to the predetermined redundancy memory cell (for example, $MC_{R11}$). At this time, the word line corresponding to the defective row address, for example $WL_1$, provided in the regular memory cell array 41 is in a non-selected state.

Although in the memory device shown in FIG. 2, only one redundancy word line $WL_R$ is provided in the redundancy memory cell array 42, it is also possible to provide a plurality of redundancy word lines in the redundancy memory cell array and to select a predetermined redundancy word line in accordance with selected defective row address bits programmed in the programming circuit by using a redundancy row decoder and driver.

As above-mentioned, in the semiconductor memory device having the redundancy memory cell array, the test is carried out before forwarding the device to the next process, in order to detect whether or not a defective memory cell exists in the regular memory cell array 41. Thus, if a defective memory cell is detected in the regular memory cell array, the defective address bits (for example, defective row address bits) corresponding to the defective memory cell are programmed in the programming circuit (for example, ROM) 8. Accordingly, when each logic of the input address bit signals (for example, input row address bit signals) coincides with each logic of the programmed defective address bits, the control signal $\phi_{WLR}$ is supplied from the switching circuit 10 to the redundancy word line $WL_R$, and the access for a predetermined redundancy memory cell is carried out instead of the access for a corresponding memory cell arranged in the regular memory cell array.

However, if it is detected that a defective memory cell does not exist in the regular memory- cell array, it is not necessary to use the redundancy memory cell array, and defective address bits are not programmed in the programming circuit (ROM) 8.

Accordingly, in the present invention, another programming circuit 11 (for example, a ROM) for programming data identifying whether or not the defective address bits are programmed in the programming circuit 8 (i.e., whether or not the redundancy memory cell array is used) is provided in addition to the above programming circuit 8. Accordingly, when the defective address bits are programmed in the programming circuit 8 (i.e., when the redundancy memory cell array is used), the potential of an output signal RDT supplied from the programming circuit 11 is set to high level by programming a high level data "1" in the programming circuit 11, and when defective address bits are not programmed in the programming circuit 8 (i.e., when the redundancy memory cell array is not used), the potential of the output signal RDT is set to low level by programming a low level data "0" in the programming circuit 11. In this connection, the above predetermined one bit logic data identifying whether or not the defective address brits are programmed in the programming circuit 8 is previously written to the programming circuit (ROM) 11 before the operation of the memory device in accordance with the result of the above-mentioned test carried out before the forwarding of the device.

Therefore, the output signal RDT having the predetermined potential level is also supplied from the above programming circuit 11 to the switching circuit 12 before the operation of the memory device.

When the potential level of the output signal RDT supplied to the switching circuit 12 is low (i.e., when defective address bits are not programmed in the programming circuit 8), the signal path through which a control signal $\phi_{WLA}$ output from the row control circuit 1 is supplied to the word decoder and driver 3 as the control signal $\phi_{WL}$ is formed by the switching circuit 12. In this connection, the control signal $\phi_{WLA}$ is supplied from the row control circuit h to the switching circuit 12 at the timing "t₀" shown in FIG. 7A which corresponds to the timing "t₀" shown in FIG. 5, and then the control signal $\phi_{WL}$ for selecting a predetermined word line provided in the regular memory cell array 41 is supplied from the switching circuit 12 to the word decoder and driver 3, as shown in FIG. 7A.

On the other hand, when the potential level of the output signal RDT supplied to the switching circuit 12 is high (i.e., when defective address bits are programmed in the programming circuit 8), the signal path through which the control signal $\phi_{WLB}$ output from the switching circuit 10 is supplied to the word decoder and driver 3 as the control signal $\phi_{WL}$ is formed by the switching circuit 12, and then the control signal $\phi_{WL}$ is supplied from the switching circuit 12 to the word decoder and driver 3, as shown in FIG. 7B. In this connection, the setting of one of the above-mentioned signal paths is completed in the switching circuit 12 before the operation of the memory device in accordance with the potential level of the output signal RDT.

Therefore, when the defective address bits are programmed in the programming circuit 8 (i.e., when the redundancy memory cell array is used), the access timing for a predetermined memory cell provided in the regular memory cell array 41 in the memory-device shown in FIG. 3 is the same as that in the memory device shown in FIG. 2. However, when the defective address bits are not programmed in the programming circuit 8 (i.e., when the redundancy memory cell array is not used), the access timing for a predetermined memory cell provided in the regular memory cell array 41 in the memory device shown in FIG. 3 is the same as that in the memory device shown in FIG. 1, and thus, it is possible to increase the access speed in the latter case.

Figure 4:
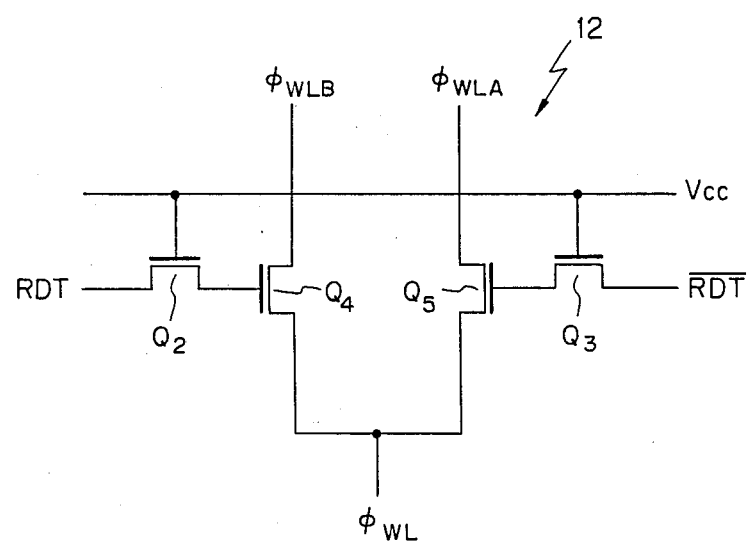
FIG. 4 shows an example of the circuit diagram of the switching circuit 12 shown in FIG. 3.

FIG. 4 is a circuit diagram showing an example of the switching circuit 12. In FIG. 4, when the potential level of the output signal RDT supplied from the programming circuit (ROM) 11 is set to high level, a transistor Q₄ is turned ON through a turned-ON transistor Q₂, and the control signal $\phi_{WLB}$ is supplied from the switching circuit 10 to the word decoder and driver 3 as the control signal $\phi_{WL}$.

On the other hand, when the potential level of the output signal $\overline{\text{RDT}}$ is set to low level (i.e., when the potential level of the inverted output signal RDT is set to high level), a transistor Q₅ is turned ON through a turned ON transistor Q₃, and the control signal $\phi_{WLA}$ is supplied from the row control circuit 1 to the word decoder and driver 3 as the control signal $\phi_{WL}$.

Although, in the above embodiment, the defective row address bits are used as defective address data, it is also possible to use defective column address bits or both defective row and column address bits as such defective address data.

According to the present invention, it is possible to increase the access speed for the selected memory cell arranged in the regular memory cell array provided in the semiconductor memory device having the redundancy memory cell array, when defective address bits are not programmed in the programming circuit (i.e., the redundancy memory cell array is not used).

I claim:
1. A semiconductor memory device comprising:
   a regular memory cell array in which a plurality of word lines and bit lines are provided, and a plurality of memory cells are arranged at each intersection of said word lines and bit lines;
   a redundancy memory cell array in which one or more word lines and bit lines are provided,. and a plurality of memory cells are arranged at each intersection of said word lines and bit lines in said redundancy memory cell;
   control means for generating a first control signal;
   means for programming defective address bits corresponding to a defective memory cell existing in said regular memory cell array;
   means for comparing each logic state of input address bits with each of said defective address bits;
   a first switching means for generating a second control signal when at least one logic state of said input address bits does not coincide with a corresponding one of said defective address bits and for supplying a third control signal to a predetermined word line or bit line belonging to said redundancy memory cell array without generating said second control signal when each logic state said input address bits coincides with each of said defective address bits;,
   means for identifying whether or not said defective address bits are programmed in said programming means; and
   a second switching means for supplying said second control signal input from said first switching means to a selected word line or bit line belonging to said regular memory cell array when said identifying means indicates that said defective address bits are programmed in said programming means and for supplying said first control signal input from said control means to said selected word line or bit line when said identifying means indicates that said defective address bits are not programmed in said programming means.

2. A semiconductor memory device according to claim 1, wherein an signal path for supplying said first control signal or said second control signal to said selected word line or bit line through said second switching means is completed in accordance with an output signal from said identifying means before the operation of said memory device.

* * * * *

UNITED STATES PATENT AND TRADEMARK OFFICE
CERTIFICATE OF CORRECTION

PATENT NO. : 4,803,656

DATED : February 7, 1989

INVENTOR(S) : Yoshihiro TAKEMAE

It is certified that error appears in the above-identified patent and that said Letters Patent is hereby corrected as shown below:

Front page [45], change "Feb. 7, 1988" to --Feb. 7, 1989--.

Col. 4, line 36, change "$\overline{RAS}$becomes" to --$\overline{RAS}$ becomes--;

line 65, after "high)" insert --.--.

Col. 5, line 13, change "suppled" tq --supplied--;

line 19, change "$A_n$" to --$\overline{A_n}$--;

line 60, change "; and to $A'_n$" to --and $\overline{A'_n}$ to $\overline{A'_n}$--.

Col. 6, line 27, after "output" insert --signal--;

line 47, change "$\phi_{W1}$" to --$\phi_{WL}$--.

Col. 7, line 11, change "$D_{oput}$" to --$D_{out}$--.

Col. 8, line 18, after "$t'_0$" change the arrows to --"--;

line 22, change "line WLR" to --line $WL_R$--;

line 62, change "memory-cell" to --memory cell--.

UNITED STATES PATENT AND TRADEMARK OFFICE
CERTIFICATE OF CORRECTION

PATENT NO. : 4,803,656

DATED : February 7, 1989

INVENTOR(S) : Yoshihiro TAKEMAE

It is certified that error appears in the above-identified patent and that said Letters Patent is hereby corrected as shown below:

Col. 9, line 17, change "brits" to --bits--;

line 35, change "circuit h" to --circuit 1--;

line 61, change "memory-device" to --memory device--.

Col. 10, line 37, change "provided,." to --provided,--;

line 54, after "state" insert --of--;

line 56, change "bits;," to --bits;--.

Col. 11, line 4, change "an" to --the--.

Signed and Sealed this

Nineteenth Day of December, 1989

Attest:

JEFFREY M. SAMUELS

Attesting Officer  Acting Commissioner of Patents and Trademarks

UNITED STATES PATENT AND TRADEMARK OFFICE
CERTIFICATE OF CORRECTION

PATENT NO. : 4,803,656
DATED : February 7, 1989
INVENTOR(S) : Yoshihiro TAKEMAE

It is certified that error appears in the above-identified patent and that said Letters Patent is hereby corrected as shown below:

Front page [45], change "Feb. 7, 1988" to --Feb. 7, 1989--.

Col. 4, line 36, change "$\overline{RAS}$becomes" to --$\overline{RAS}$ becomes--;

line 65, after "high)" insert --.--.

Col. 5, line 13, change "suppled" to --supplied--;

line 19, change "$A_n$" to --$\overline{A_n}$--;

line 60, change "; and to $A'_n$" to --and $\overline{A'_o}$ to $\overline{A'_n}$--.

Col. 6, line 27, after "output" insert --signal--;

line 47, change "$\phi_{W1}$" to --$\phi_{WL}$--.

Col. 7, line 11, change "$D_{oput}$" to --$D_{out}$--.

Col. 8, line 18, after "$t'_0$" change the arrows to --"--;

line 22, change "line WLR" to --line $WL_R$--;

line 62, change "memory-cell" to --memory cell--.

UNITED STATES PATENT AND TRADEMARK OFFICE
CERTIFICATE OF CORRECTION

PATENT NO. : 4,803,656

DATED : February 7, 1989

INVENTOR(S) : Yoshihiro TAKEMAE

It is certified that error appears in the above-identified patent and that said Letters Patent is hereby corrected as shown below:

Col. 9, line 17, change "brits" to --bits--;

line 35, change "circuit h" to --circuit 1--;

line 61, change "memory-device" to --memory device--.

Col. 10, line 37, change "provided,." to --provided,--;

line 54, after "state" insert --of--;

line 56, change "bits;," to --bits;--.

Col. 11, line 4, change "an" to --the--.

This certificate supersedes Certificate of Correction issued December 19, 1989.

Signed and Sealed this

Twenty-sixth Day of June, 1990

Attest:

HARRY F. MANBECK, JR.

*Attesting Officer*  *Commissioner of Patents and Trademarks*